United States Patent [19]
Kim

[11] Patent Number: 5,963,077
[45] Date of Patent: Oct. 5, 1999

[54] AUTO MODE SELECTOR

[75] Inventor: Jung Pill Kim, Ichon-shi, Rep. of Korea

[73] Assignee: Hyundai Electronics Industries Co., Ltd., Kyoungki-do, Rep. of Korea

[21] Appl. No.: 08/864,471

[22] Filed: May 28, 1997

[30] Foreign Application Priority Data

Jun. 29, 1996 [KR] Rep. of Korea ...................... 96-25739

[51] Int. Cl.⁶ ................................................. H03K 17/62
[52] U.S. Cl. .............................................. 327/408; 327/99
[58] Field of Search ............................. 327/99, 407, 408, 327/544

[56] References Cited

U.S. PATENT DOCUMENTS

| | | | |
|---|---|---|---|
| 4,985,641 | 1/1991 | Nagayama et al. | 327/198 |
| 5,504,452 | 4/1996 | Takenaka | 327/541 |
| 5,583,457 | 12/1996 | Horiguchi et al. | 326/121 |
| 5,614,847 | 3/1997 | Kawahara et al. | 326/98 |
| 5,764,099 | 6/1998 | Hewitt | 327/545 |
| 5,811,996 | 9/1998 | Oyabe et al. | 327/110 |

FOREIGN PATENT DOCUMENTS

| | | |
|---|---|---|
| 0 771 072 A1 | 5/1997 | European Pat. Off. . |
| 2 296 592 | 7/1996 | United Kingdom . |

Primary Examiner—Kenneth B. Wells
Assistant Examiner—Maria Hasanzadah
Attorney, Agent, or Firm—Gary M. Nath; Gregory B. Kang; Nath & Associates

[57] ABSTRACT

An auto mode selector for a semiconductor memory device having a reference voltage selection switching circuit connected between a reference voltage pin and an internal reference voltage terminal, for selecting one of CTT and LVTTL in response to a reference voltage selection signal. The auto mode selector further includes an input leakage current controller for allowing current to flow through a resistor between a supply voltage source and the reference voltage pin only for a predetermined time period in response to an input leakage current control signal from an input leakage current control signal generator. According to the present invention, the amount of input leakage current and standby current can be reduced.

6 Claims, 4 Drawing Sheets

AUTO MODE SELECTOR

BACKGROUND OF THE INVENTION

1. Field of the Invention

The present invention relates in general to auto mode selectors, and more particularly to an auto mode selector for automatically recognizing an input/output interface such as a low voltage transistor transistor logic (referred to hereinafter as "LVTTL") or a high-speed input/output interface such as a center tapped ternminated logic (referred to hereinafter as "CTT") in a synchronous memory device without using any other option.

2. Description of the Prior Art

Generally, in a device employing input/output interfaces of two types, the interfaces must be provided in the chip by means of bonding or a metal option. However, such bonding or metal option causes the user not to change the chip of one type to that of the other type, resulting in an inconvenience in use. For this reason, the chip must automatically select one of the two modes according to external environments so that it can be made according to a user's requirement. For example, a memory employing LVTTL and CTT has a difference between the LVTTL and CTT in view of an external package pin. Namely, in the case of CTT, a reference voltage is supplied from the external pin because an input buffer is provided with a differential comparator. However, in the case of LVTTL, no reference voltage is supplied from the external pin. As a result, an internal reference voltage is used as the reference voltage of the comparator.

FIG. 1A is a circuit diagram illustrating the construction of a conventional reference voltage selector. As shown in this drawing, whether the present mode is LVTTL or CTT is discriminated using a resistor R1 connected between an external reference voltage pin Vrefp and a supply voltage source Vcc. Namely, current is supplied to the reference voltage pin Vrefp to discriminate whether the reference voltage pin Vrefp is in a floating state, and whether the present mode is LVTTL or CTT is then discriminated in accordance with the discriminated result of the reference voltage pin Vrefp. In the case of LVTTL, the reference voltage pin Vrefp is in the floating state because it is supplied with no external reference voltage. However, in the case of CTT, the reference voltage pin Vrefp has a reference voltage level because it is supplied with an external reference voltage. As a result, if Vrefp=Vcc under the condition that constant current flows to the reference voltage pin Vrefp, the present mode is decided on LVTTL due to the floating state. However, if Vrefp=Vref under the condition that constant current flows to the reference voltage pin Vrefp, the present mode is decided on CTT.

In this manner, the discrimination between LVTTL and CTT is made by comparing a voltage on the reference voltage pin Vrefp with a specified voltage. For example, a comparator may be used to compare the voltage on the reference voltage pin Vrefp with 3Vcc/4. In this case, if Vrefp=Vcc, the present mode is LVTTL. However, if Vrefp=Vref=Vcc/2, the present mode is CTT. In more detail with reference to FIG. 1A, the reference numeral 1 designates a switching circuit. In the switching circuit 1, "Vrefp" indicates an external reference voltage Vref from an external reference voltage pad, "Vref_int" indicates an internal reference voltage Vref to be used in the case of LVTTL, and "T1" and "T2" designate switching elements for selecting one of the external and internal reference voltages Vrefp and Vref_int according to the interface type. The reference voltage selected by the switching elements is transferred to input comparison means of an input buffer.

FIG. 1B is a circuit diagram illustrating the construction of a conventional auto mode selector. As shown in this drawing, the conventional auto mode selector comprises a differential amplifier 3 as comparison means of the auto mode selector, a comparison voltage generator 2 for generating a comparison voltage to one input terminal of the differential amplifier 3, and a flip-flop circuit 4 for generating a reference voltage selection signal Lv_cttb in response to an output signal Outb from the differential amplifier 3 and a power-up signal Pwrup.

The operation of the conventional auto mode selector with the above-mentioned construction will hereinafter be described.

The comparison voltage Vr of 3Vcc/4 is generated by the comparison voltage generator 2 and then applied to one input terminal of the differential amplifier 3, the other input terminal of which is connected to the reference voltage pin Vrefp. In the case of CTT, Lv_cttb=low because Vrefp=Vref and Vr=3Vcc/4. However, in the case of LVTTL, L_cttb=high because Vrefp=Vcc and Vr=3Vcc/4. Then, the reference voltage selection signal Lv_cttb generated by the flip-flop circuit 4 is applied to the switching elements T1 and T2 in FIG. 1A. As a result, the reference voltage selection operation is performed in such a manner that Vref=Vrefp in the case of CTT, and Vref=Vref_int in the case of LVTTL.

However, the above-mentioned conventional auto mode selector has a disadvantage in that the consumptive flow of standby current from the supply voltage source to the ground voltage source is caused when the comparison voltage is generated. Further, in the case of CTT, when the external reference voltage is supplied to the reference voltage pin Vrefp, the amount of input leakage current becomes large due to the connection of the resistor R1 to the reference voltage pin Vrefp.

SUMMARY OF THE INVENTION

The present invention has been made in view of the above problems, and it is an objective of the present invention to provide an auto mode selector in which current flows to a comparison voltage generator and a reference voltage pin only for a predetermined time period, so that the amount of input leakage current and standby current can be reduced.

In accordance with the present invention, the above and other objects can be accomplished by a provision of an auto mode selector for a semiconductor memory device having reference voltage selection switching means connected between a reference voltage pin and an internal reference voltage terminal, for selecting one of CTT and LVTTL in response to a reference voltage selection signal, wherein the improvement comprises input leakage current control means for allowing current to flow through a resistor between a supply voltage source and the reference voltage pin only for a predetermined time period in response to an input leakage current control signal from input leakage current control signal generation means.

BRIEF DESCRIPTION OF THE DRAWINGS

The above and other objective, features and advantages of the present invention will be more clearly understood from the following detailed description taken in conjunction with the accompanying drawings, in which.

DETAILED DESCRIPTION OF THE PREFERRED EMBODIMENTS

Figure 1A:
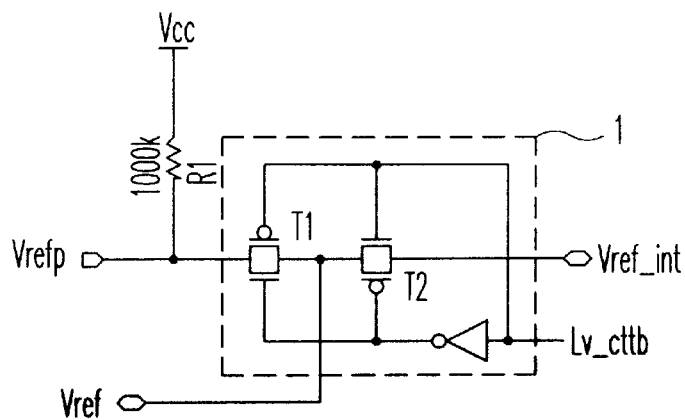
FIG. 1A is a circuit diagram illustrating the construction of a conventional reference voltage selector.
Figure 1B:
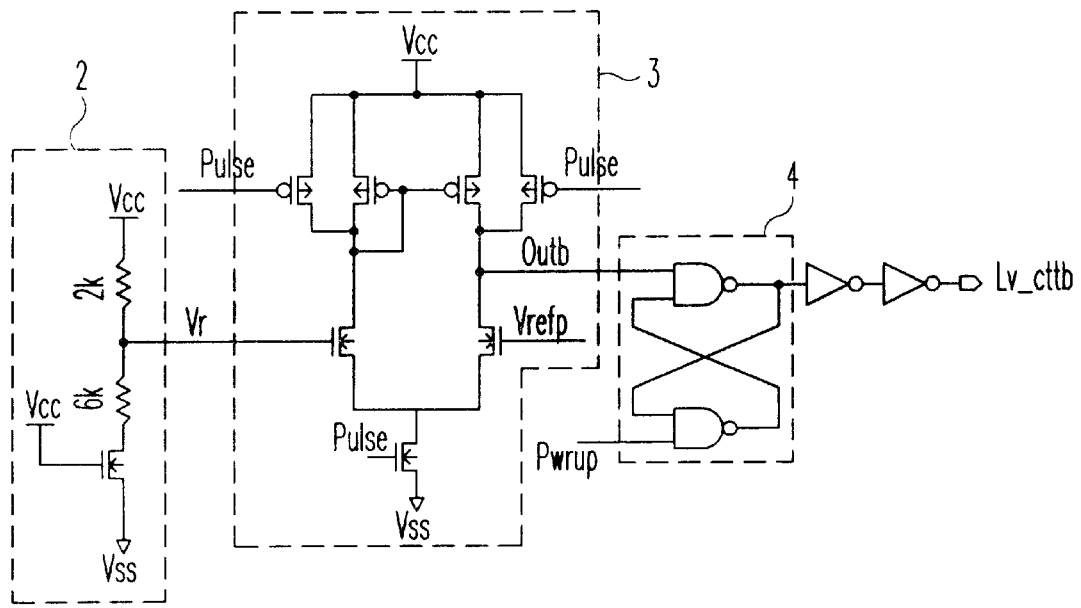
FIG. 1B is a circuit diagram illustrating the construction of a conventional auto mode selector.
Figures 2A, 2B:
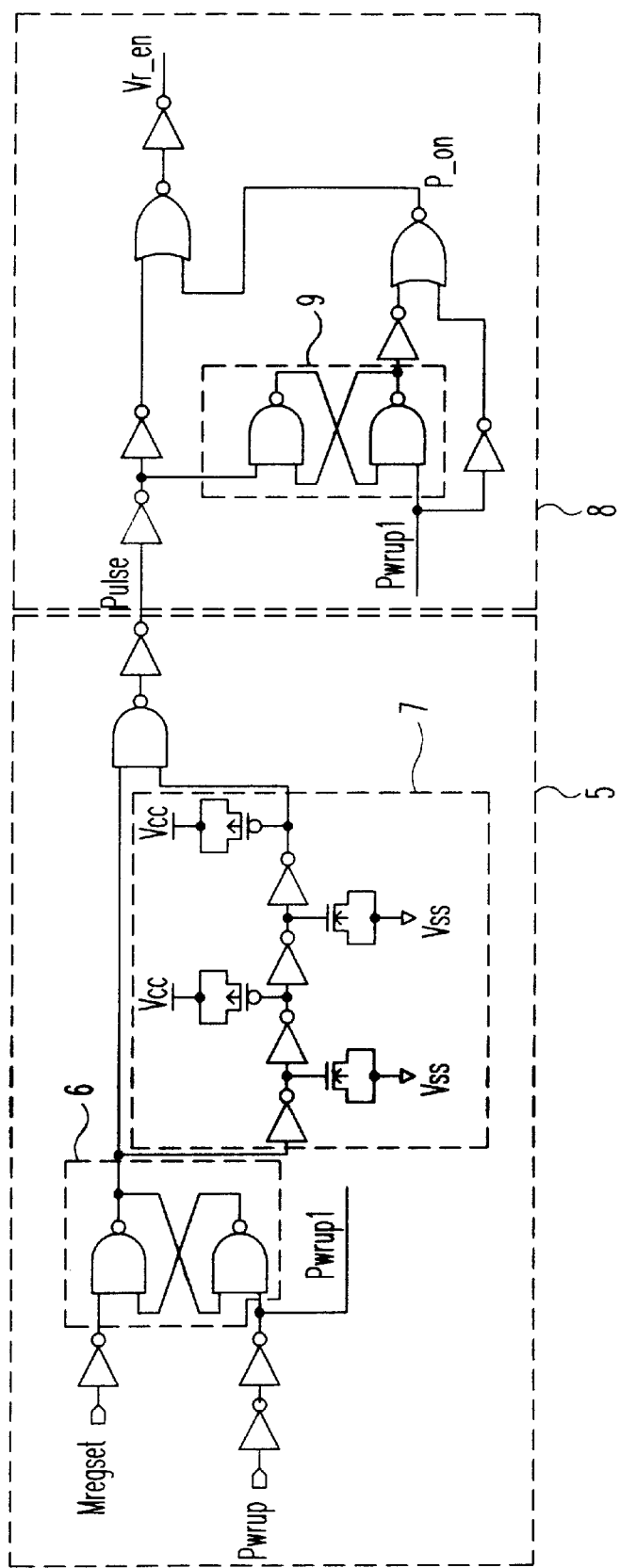
FIG. 2A is a circuit diagram illustrating the construction of a pulse generator in accordance with an embodiment of the present invention.
FIG. 2B is a circuit diagram illustrating the construction of an input leakage current control signal/comparison voltage generation signal generator in accordance with the embodiment of the present invention.

FIG. 2A is a circuit diagram illustrating the construction of a pulse generator in accordance with an embodiment of the present invention. As shown in this drawing, the pulse generator comprises a first inverter for inverting a mode register set signal Mregset, second and third inverters connected in series, for sequentially inverting a power-up signal Pwrup, a flip-flop circuit 6 for inputting an output signal from the first inverter and an output signal Pwrup1 from the third inverter, a delay circuit 7 for delaying an output signal from the flip-flop circuit 6 for a predetermined time period, a NAND gate for performing a NAND operation with respect to the output signal from the flip-flop circuit 6 and an output signal from the delay circuit 7, and a fourth inverter for inverting an output signal from the NAND gate and outputting the inverted signal as a pulse signal Pulse.

FIG. 2B is a circuit diagram illustrating the construction of an input leakage current control signal/comparison voltage generation signal generator (referred to hereinafter as "signal generator") in accordance with the embodiment of the present invention. As shown in this drawing, the signal generator comprises first and second inverters connected in series, for sequentially inverting the pulse signal Pulse from the pulse generator in FIG. 2A, a flip-flop circuit 9 for inputting an output signal from the first inverter and the output signal Pwrup1 from the third inverter in the pulse generator in FIG. 2A, a third inverter for inverting an output signal from the flip-flop circuit 9, a fourth inverter for inverting the output signal Pwrup1 from the third inverter in the pulse generator in FIG. 2A, a first NOR gate for performing a NOR operation with respect to output signals from the third and fourth inverters and outputting the NORed result as an input leakage current control signal P_on, a second NOR gate for performing a NOR operation with respect to an output signal from the second inverter and the input leakage current control signal P_on from the first NOR gate, and a fifth inverter for inverting an output signal from the second NOR gate and outputting the inverted signal as a comparison voltage generation signal Vr_en.

Figure 2C:
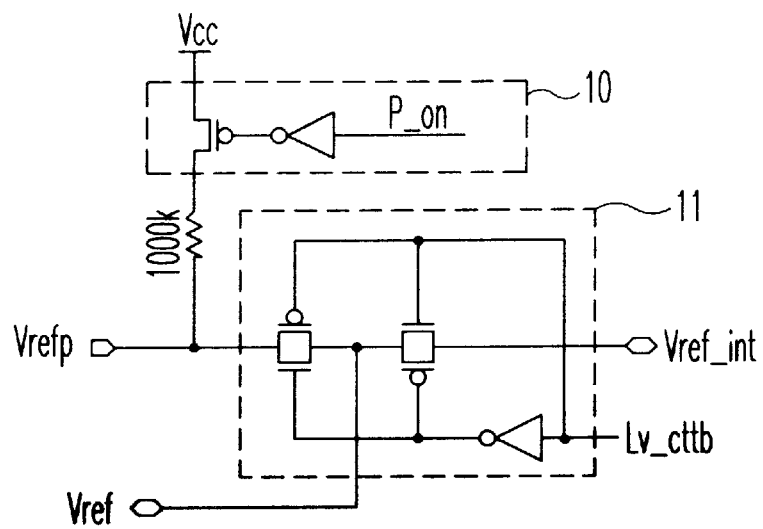
FIG. 2C is a circuit diagram illustrating the construction of a reference voltage selector in accordance with the embodiment of the present invention.

FIG. 2C is a circuit diagram illustrating the construction of a reference voltage selector in accordance with the embodiment of the present invention. As shown in this drawing, the reference voltage selector comprises an input leakage current controller 10 for controlling the amount of input leakage current in response to the input leakage current control signal P_on from the signal generator in FIG. 2B, a resistor connected between the input leakage current controller 10 and a reference voltage pin Vrefp, and a reference voltage selection circuit 11 connected between the reference voltage pin Vrefp and an internal reference voltage terminal Vref_int.

The input leakage current controller 10 includes a first inverter for inverting the input leakage current control signal P_on from the signal generator in FIG. 2B, and a first PMOS transistor connected between a supply voltage source Vcc and the resistor, said PMOS transistor having its gate for inputting an output signal from the first inverter.

The reference voltage selection circuit 11 includes a second PMOS transistor connected between the reference voltage pin Vrefp and an input terminal of an input buffer and having its gate for inputting a reference voltage selection signal Lv_cttb, a second inverter for inverting the reference voltage selection signal Lv_cttb, a first NMOS transistor connected between the reference voltage pin Vrefp and the input terminal of the input buffer and having its gate for inputting an output signal from the second inverter, a second NMOS transistor connected between the input terminal of the input buffer and the internal reference voltage terminal Vref_int and having its gate for inputting the reference voltage selection signal Lv_cttb, and a third PMOS transistor connected between the input terminal of the input buffer and the internal reference voltage terminal Vref_int and having its gate for inputting the output signal from the second inverter.

Figure 2D:
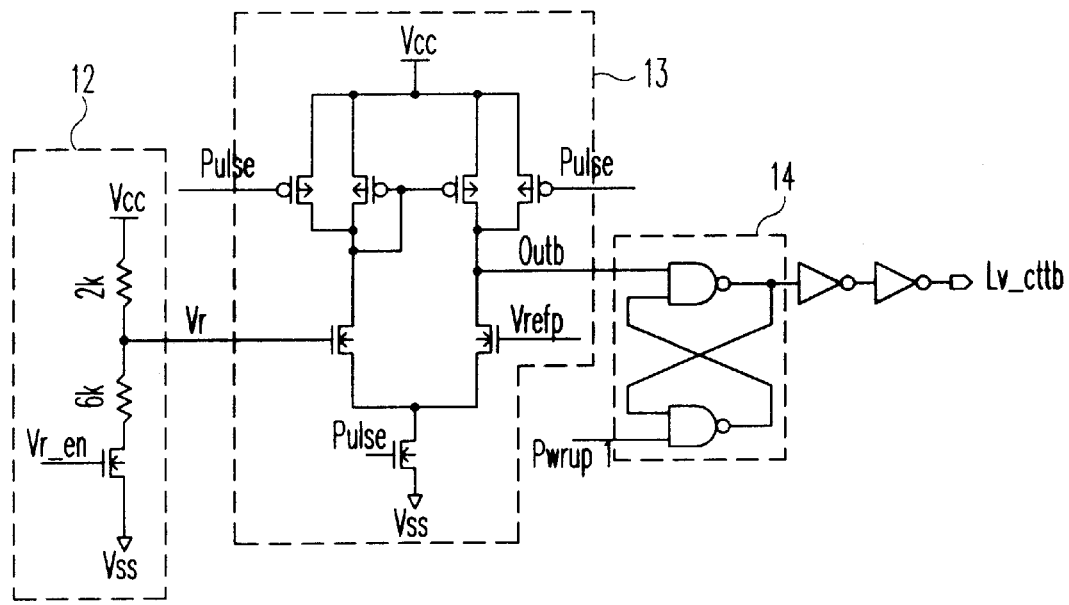
FIG. 2D is a circuit diagram illustrating the construction of an auto mode selector in accordance with the embodiment of the present invention.

FIG. 2D is a circuit diagram illustrating the construction of an auto mode selector in accordance with the embodiment of the present invention. As shown in this drawing, the auto mode selector comprises a comparison voltage generator 12 for generating a comparison voltage Vr, a differential amplifier 13 for differential-amplifying the comparison voltage Vr from the comparison voltage generator 12 and a voltage on the reference voltage pin Vrefp, a flip-flop circuit 14 for inputting an output signal from the differential amplifier 13 and the output signal Pwrup1 from the third inverter in the pulse generator in FIG. 2A, and two inverters connected in series, for sequentially inverting an output signal from the flip-flop circuit 14 and outputting the inverted signal as the reference voltage selection signal Lv_cttb.

The comparison voltage generator 12 includes a first resistor connected between the supply voltage source Vcc and an output terminal, a first NMOS transistor connected between the output terminal and the ground voltage source Vss and having its gate for inputting the comparison voltage generation signal Vr_en from the signal generator in FIG. 2B, and a second resistor connected between the output terminal and a drain of the first NMOS transistor.

The differential amplifier 13 includes a second NMOS transistor having its gate for inputting the comparison voltage Vr from the comparison voltage generator 12, first and second PMOS transistors connected in parallel between the supply voltage source Vcc and a drain of the second NMOS transistor, and third and fourth PMOS transistors connected in parallel between the supply voltage source Vcc and an output terminal. The first and fourth PMOS transistors have their gates for commonly inputting the pulse signal Pulse from the pulse generator in FIG. 2A, and the second and third PMOS transistors have their gates connected in common to the drain of the second NMOS transistor.

The differential amplifier 13 further includes a third NMOS transistor connected between a source of the second NMOS transistor and the ground voltage source Vss and having its gate for inputting the pulse signal Pulse from the pulse generator in FIG. 2A, and a fourth NMOS transistor connected between the output terminal and the ground voltage source Vss and having its gate connected to the reference voltage pin Vrefp.

The operations of the pulse generator, signal generator, reference voltage selector and auto mode selector with the above-mentioned constructions in accordance with the embodiment of the present invention will hereinafter be described in detail with reference to FIG. 3.

Figure 3:
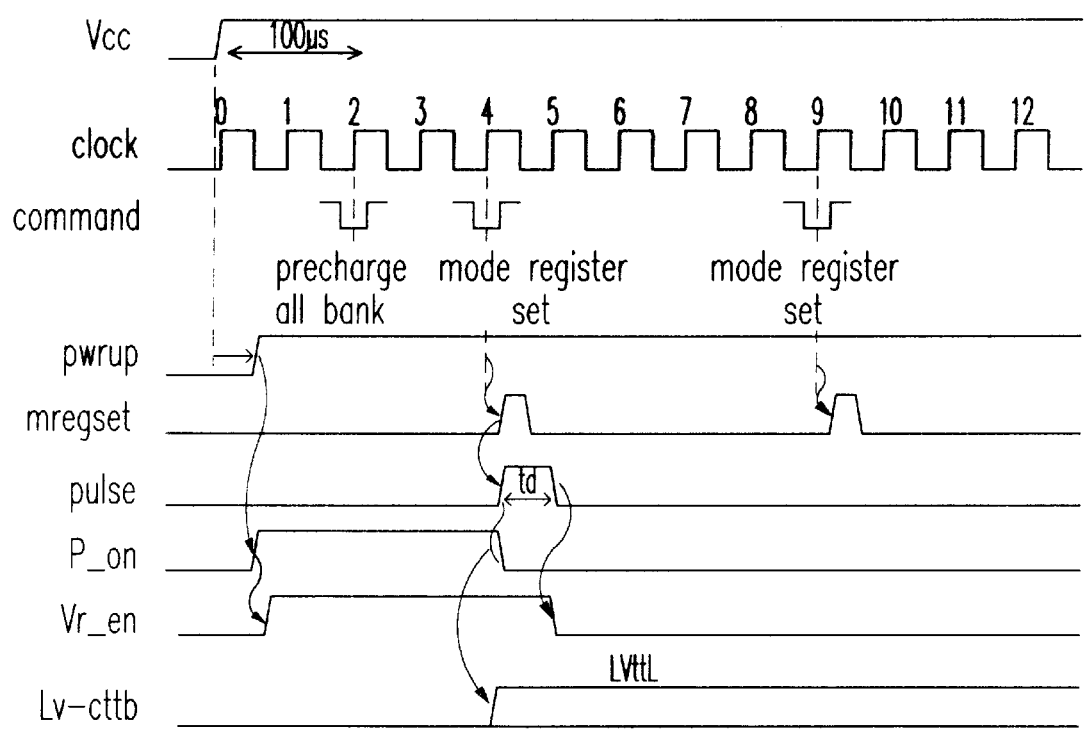
FIG. 3 is a timing diagram of signals in FIGS. 2A to 2D.

FIG. 3 is a timing diagram of the signals in FIGS. 2A to 2D.

In FIG. 2A, the pulse generator generates the pulse signal Pulse synchronously with the input time of the first mode register set command Mregset after power is supplied to the chip. The generated pulse signal Pulse has a pulse duration td. The pulse generator generates no pulse in response to the subsequent mode register set commands.

In FIG. 2B, the signal generator generates the input leakage current control signal P_on in response to the pulse signal Pulse from the pulse generator to control the input leakage current controller 10 in FIG. 2C. Also, the signal generator generates the comparison voltage generation signal Vr_en in response to the pulse signal Pulse from the pulse generator to control standby current in the comparison voltage generator 12 in FIG. 2D.

In FIG. 2C, the input leakage current controller 10 applies a switching signal to a resistor path to the reference voltage pin Vrefp in response to the input leakage current control signal P_on from the signal generator in FIG. 2B. As a result, current flows to the reference voltage pin Vrefp through the resistor only for a pulse duration of the input leakage current control signal P_on to reduce the amount of input leakage current.

In FIG. 2D, the switching element in the comparison voltage generator 12 is operated in response to the comparison voltage generation signal Vr_en from the signal generator in FIG. 2B to remove standby current when the comparison voltage Vr is generated. As a result, the comparison voltage Vr is generated only for a predetermined time period where the state of the reference voltage pin Vrefp is detected.

In more detail with reference to FIG. 3, a given sequence in specification must be advanced with respect to all the chip parts when power is supplied. As shown in the timing diagram of FIG. 3, after the lapse of 100µs from the supply of power, a synchronous part precharges all banks and then performs a mode register set operation after several clocks are generated. Here, the mode register set operation is the essential command to be performed immediately after the power is supplied in order to determine column address strobe latency, burst type and burst length. The pulse signal Pulse is generated using the mode register set command Mregset and the power-up signal Pwrup which confirms the supply of power. Namely, the pulse signal Pulse is generated by detecting the first mode register set command Mregset after the power-up signal Pwrup is generated. The input leakage current control signal P_on is generated using the pulse signal Pulse and the power-up signal Pwrup. At this time, the input leakage current control signal P_on has an active interval from the generation of power-up signal Pwrup till the input of first mode register set command Mregset. The input leakage current controller 10 is operated only for the active interval of the input leakage current control signal P_on.

Also, the comparison voltage generation signal Vr_en is generated using the pulse signal Pulse and the power-up signal Pwrup. At this time, the comparison voltage generation signal Vr_en has an active interval from the generation of power-up signal Pwrup till the end of first mode register set command Mregset. The comparison voltage generator 12 is operated only for the active interval of the comparison voltage generation signal Vr_en.

As is apparent from the above description, according to the present invention, the auto mode selector can be implemented in a semiconductor memory device so that the amount of input leakage current and standby current can be reduced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An auto mode selector for a semiconductor memory device having reference voltage selection switching means connected between a reference voltage pin and an internal reference voltage terminal, for selecting one of CTT and LVTTL in response to a reference voltage selection signal, wherein the improvement comprises input leakage current control means for allowing current to flow through a resistor between a supply voltage source and said reference voltage pin only for a predetermined time period in response to an input leakage current control signal from input leakage current control signal generation means wherein said input leakage current control signal generation means includes:

a first inverter for inverting a pulse signal from pulse generation means;

first flip-flop means for latching a twice-inverted power-up signal in response to an output signal from said first inverter;

a second inverter for inverting said twice-inverted power-up signal;

a third inverter for inverting an output signal from said first flop-flop means; and a NOR gate for performing a NOR operation with respect to output signals from said second and third inverters and outputting the NORed result as said input leakage current control signal.

2. An auto mode selector for a semiconductor memory device as set forth in claim 1, wherein said pulse generation means includes:

a fourth inverter for inverting a mode register set signal;

fifth and sixth inverters for sequentially inverting a power-up signal to output said twice-inverted power-up signal;

second flip-flop means for latching an output signal from said sixth inverter in response to an output signal from said fourth inverter;

delay means for delaying an output signal from said second flip-flop means;

a NAND gate for performing a NAND operation with respect to the output signal from said second flip-flop means and an output signal from said delay means; and a seventh inverter for inverting an output signal from said NAND gate and outputting the inverted signal as said pulse signal.

3. An auto mode selector for a semiconductor memory device as set forth in claim 1, further comprising comparison voltage generation signal generation means for generating a comparison voltage generation signal in response to the output signal from said first inverter and said input leakage current control signal from said input leakage current control signal generation means.

4. An auto mode selector for a semiconductor memory device as set forth in claim 3, wherein said comparison voltage generation signal from said comparison voltage generation signal generation means is applied to a gate of a MOS transistor in comparison voltage generation means.

5. An auto mode selector for a semiconductor memory device having reference voltage selection switching means connected between a reference voltage pin and an internal reference voltage terminal, for selecting one of CTT and LVTTL in response to a reference voltage selection signal, wherein the improvement comprises input leakage current control means for allowing current to flow through a resistor between a supply voltage source and said reference voltage pin only for a predetermined time period in response to an input leakage current control signal from input leakage current control signal generation means wherein said input leakage current control means includes a MOS transistor connected between said supply voltage source and said resistor and having its gate for inputting said input leakage current control signal from said input leakage current control signal generation means wherein said input leakage current control signal generation means includes:

a first inverter for inverting a pulse signal from pulse generation means;

first flip-flop means for latching a twice-inverted power-up signal in response to an output signal from said first inverter;

a second inverter for inverting said twice-inverted power-up signal;

a third inverter an output signal from said first flip-flop means; and a NOR gate for performing a NOR operation with respect to output signals from said second and third inverters and outputting the NORed result as said input leakage current control signal.

6. An auto mode selector for a semiconductor memory device having reference voltage selection switching means connected between a reference voltage pin and an internal reference voltage terminal, for selecting one of CTT and LVTTL in response to a reference voltage selection signal, wherein the improvement comprises input leakage current control means for allowing current to flow through a resistor between a supply voltage source and said reference voltage pin only for a predetermined time period in response to an input leakage current control signal from input leakage current control signal generation means, and wherein the predetermined time period is between the time when a powerup signal which indicates the timing of a turned-on state of a supply voltage source is activated and the time when a mode register set signal which indicates an operating mode of the semiconductor memory device is activated.

* * * * *